United States Patent [19]

Shelly

[11] 4,423,341

[45] Dec. 27, 1983

[54] FAST SWITCHING FIELD EFFECT TRANSISTOR DRIVER CIRCUIT

[75] Inventor: Randolph D. W. Shelly, Rosemere, Canada

[73] Assignee: Sperry Corporation, New York, N.Y.

[21] Appl. No.: 222,032

[22] Filed: Jan. 2, 1981

[51] Int. Cl.³ .................... H03K 17/687; H03K 17/04
[52] U.S. Cl. .................................... 307/570; 307/270; 307/577
[58] Field of Search ............... 307/246, 270, 575, 577, 307/584, 282, 582, 412, 570, 571, 255, 254

[56] References Cited

U.S. PATENT DOCUMENTS 3,805,094 4/1974 Orlando .......................... 307/270 X
4,032,838 6/1977 Minami et al. ................... 307/570 X
4,052,623 10/1977 Loberg ................................. 307/571

FOREIGN PATENT DOCUMENTS 54-158849 12/1979 Japan ................................... 307/270

Primary Examiner—Larry N. Anagnos
Assistant Examiner—David R. Bertelson
Attorney, Agent, or Firm—Howard P. Terry

[57] ABSTRACT

A high frequency inverter power supply having isolation between the drive circuitry and the Power Switching device and utilizing a Field Effect Transistor as the Power Switching device is described. Circuitry for rapidly charging the gate capacitance of the Field Effect Transistor for enhancing the rate of its switching to the conductive state and for rapidly discharging the gate capacitance for enhancing the rate of its switching to the non-conductive state is shown.

6 Claims, 5 Drawing Figures

FAST SWITCHING FIELD EFFECT TRANSISTOR DRIVER CIRCUIT

BACKGROUND OF THE INVENTION

This invention relates to power supplies in general, and more particularly, it relates to high frequency inverter power supplies.

It has been common practice to utilize Bipolar Switching Transistors as the switching device in prior art inverter type power supplies. Bipolar Transistors in power supplies operating in the 20 to 30 kHz range have been widely used. When it is desired to move the switching power supply operation into frequencies of 200 kHz or higher, problems with the use of Bipolar Transistors are encountered. The Bipolar Transistors are current controlled and often require ampere-level base-drive current sources. Further, they exhibit switching delays due to the minority-carrier storage time. Further, Bipolar Transistors are subject to second-breakdown failure; and, due to their negative temperature coefficient, tend to result in failure due to current crowding within the device; and tend to be sensitive to temperature variations.

The inverter type power supplies often require isolation between drive circuitry and the Power Switching device, the most common type of isolation being provided by a transformer. When it is attempted to move the operational rates into the higher frequency ranges, it would normally be required that the transformer have low bias requirements, that is low magnetizing current, low interwinding capacitance and low leakage inductance. A transformer to meet these requirements for a very fast switching application, for example in the range of 15 nanoseconds, would be very difficult and costly to design and achieve.

SUMMARY OF THE INVENTION

This invention relates to an inverter type power supply that provides isolation between the drive circuitry and a Power Switching device. The Power Switching device is a Field Effect Transistor which exhibits the characteristics that it is voltage controlled rather than current controlled and has a very small instantaneous leakage current that flows through the gate circuit, resulting in DC current gains in the order of $10^9$. Further, the high impedance associated with the gate circuit permits relatively low current drive circuits to be coupled directly to the gate circuit. Field Effect Transistors are majority-carrier devices, hence do not exhibit minority-carrier storage time delays. The switching-delay time of the Field Effect Transistor can be in the nanosecond range and results primarily from gate capacitance that must be charged and discharged. Field Effect Transistors do not characteristically display second-breakdown failure, and have a positive temperature coefficient which tends to equalize current throughout the device. Field Effect Transistors exhibit characteristics of temperature stability of gain and switching time due primarily to the fact that switching is dependent upon the charging and discharging of the gate capacitance, which does not alter appreciably with temperature changes.

In the present invention, there is included a Pulse Transformer having primary and secondary windings, with the primary windings adapted for coupling to sources of DC voltage. An input switching device is provided utilizing a Switching Transistor coupled to the primary windings and adapted for receiving control pulses which cause the Switching Transistor to be switched to the conducting and nonconducting state thereby producing an alternating voltage across the primary winding. The gate circuit of a Field Effect Transistor is coupled to the secondary winding of the Pulse Transformer through a gate charging and discharging circuit which functions to enhance the rate at which the gate capacitance is charged during the time of the switching the Field Effect Transistor to its conductive state, and to enhance the rate at which the gate capacitance is discharged when the Field Effect Transistor is being switched to the non-conductive state, thereby resulting in a decrease in the delay of the switching operation normally attributed to the gate capacitance charging and discharging requirements. The circuit arrangement allows for the use of relatively easily obtained Pulse Transformers, rather than requiring the close designed requirements mentioned above, while providing the operation and isolation of the Pulse Transformer action in the circuit, thus providing an inverter type power supply that operates at frequencies substantially greater than those that can be readily achieved utilizing Bipolar Junction Transistor devices.

OBJECTS

In view of the foregoing Background of the Invention and the Summary of the Invention, it is therefore an object of this invention to provide an improved inverter type power supply capable of operating at very high frequencies.

It is a further object of this invention to provide an improved power supply that utilizes a Field Effect Transistor as the Power Switching device.

Yet a further object of this invention is to provide an improved inverter type power supply that utilizes a Field Effect Transistor as the Power Switching device, and incorporates circuitry for enhancing the rate of charging the gate capacitance of the Field Effect Transistor to enhance the switching of the Field Effect Transistor to the current conducting state, and to provide circuitry for enhancing the rate of discharge of the gate capacitance for enhancing the rate of which the Field Effect Transistor can be switched to the non-conducting state.

Still a further object of this invention is to provide an improved inverter type power supply utilizing a Power Switching Transistor as the Power Switching device, that does not require the use of specially designed Pulse Transformers while providing switching rates at rates that are orders of magnitude greater than presently available utilizing Bipolar Transistor devices.

Yet a further object of this invention is to provide an improved inverter type power supply with reduced power dissipation required in the switching operation.

Still a further object of this invention is to provide an improved inverter type power supply utilizing a Field Effect Transistor as the switching device that has a high degree of temperature stability.

These and other objects and advantages of the invention will become apparent to those having skill in the art upon the reading of the following detailed description, when taken in conjunction with the accompanying drawings in which:

DESCRIPTION OF THE PREFERRED EMBODIMENT

Figure 1:
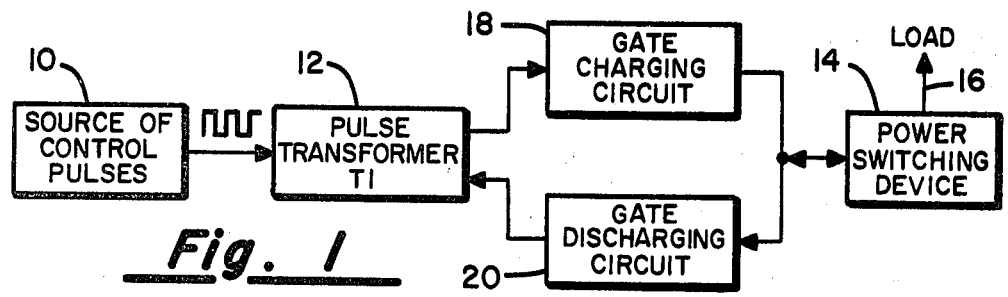
FIG. 1 is block diagram of an inverter type power supply having isolation between the drive circuitry and the Power Switching device and utilizing gate charging and gate discharging circuitry to enhance switching rates.

FIG. 1 is a block diagram of an inverter type power supply having isolation between the drive circuitry and the power switching device. In the configuration, a Source of Control Pulses 10 provides switching control pulses for controlling the operation of the primary winding of Pulse Transformer 12. A Field Effect Transistor hereinafter referred to as FET is utilized as the Power Switching Device 14, the operation of which provides the power pulses on line 16 to the Load. It is desired to switch the Power Switching Device 14 at rates such that pulse widths of less than fifteen nanoseconds are achieved while maintaining isolation of the power circuit from the control logic. The speed at which the FET can be switched is dependent upon the rate at which the gate of the FET can be charged and discharged. To this end, Gate Charging Circuit 18 is coupled intermediate the Pulse Transformer secondary and the gate of the FET for rapidly charging the gate circuit of the FET in response to applied input pulses thereby causing the FET to switch ON. The circuit also provides a Gate Discharging Circuit 20 coupled intermediate the secondary of the Pulse Transformer and the gate circuit of the FET for rapidly discharging the capacitance when the control pulse is switched OFF, thereby switching the FET OFF. In terms of voltage levels, a low gate voltage produces an OFF state of the FET that is non-conducting, while a relatively high gate voltage produces an ON state where the FET is conducting.

Figure 2:
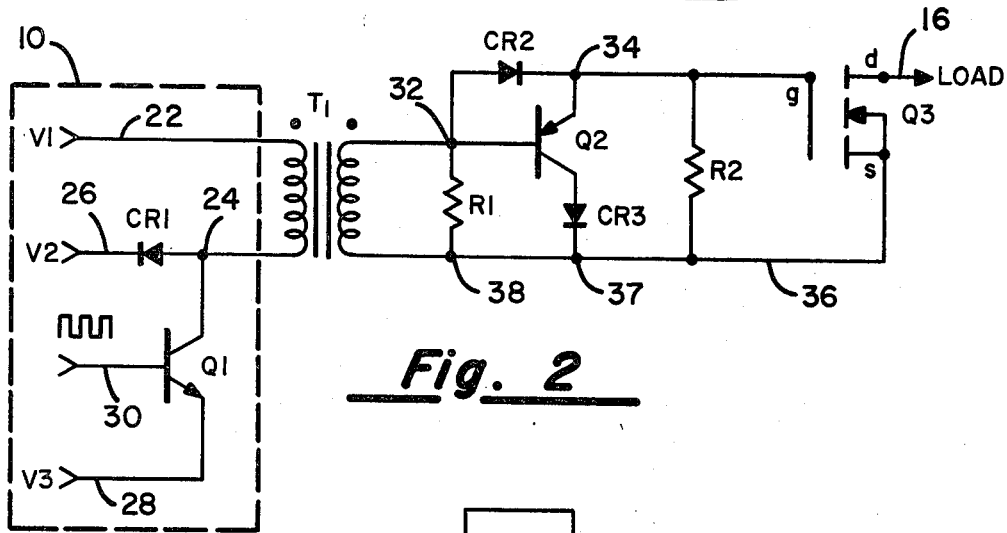
FIG. 2 is a circuit schematic diagram of one embodiment of the Fast Switching Field Effect Transistor Driver Circuit of the present invention that utilizes a Switching Transistor in the gate capacitance discharge path for enhancing the rate of discharge of the gate capacitance.

FIG. 2 is a circuit schematic diagram of one embodiment of the fast switching FET driver circuit of the present invention. A Pulse Transformer T1 has one terminal 22 of its primary winding coupled to a source of DC voltage V1, and its other primary terminal coupled to junction 24. The anode of Diode CR1 is coupled to junction 24 and its cathode is coupled to terminal 26 which is adapted for connection to a source of DC voltage V2. Switching Transistor Q1 has its collector coupled to junction 24 and its emitter coupled to terminal 28 which is adapted for receiving a source of DC voltage V3. The base terminal of transistor Q1 is coupled to terminal 30 which is adapted for receiving control pulses from a source (not shown). For this embodiment, V1 is nominally 5 volts DC, V2 is nominally 12 volts DC, and V3 is nominally 0 volts DC. A Diode CR1 and Switching Transistor Q1 are low voltage devices that are available commercially.

Pulse Transformer T1 can be relatively simple and inexpensive due to the circuit configuration. Characteristically, it should have a 1:1 turns ratio for example having four primary turns and four secondary turns wound on a 16 millimeter ferrite toroid, and should preferably be bifilar wound.

The Gate Charging circuit/Gate Discharging circuit is comprised of the secondary winding of Pulse Transformer T1, Diode CR2, Diode CR3, Switching Transistor Q2, and Resistor R1. Circuit junction 32 is coupled to the anode of Diode CR2, one terminal of Resistor R1, one terminal of the secondary winding of Pulse Transformer T1, and the base terminal of Switching Transistor Q2. Circuit junction 34 is coupled to the cathode of Diode CR2, the emitter electrode of Switching Transistor Q2, and the gate g circuit for FET Q3. The anode of Diode CR3 is coupled to the collector terminal of Switching Transistor Q2, and its cathode terminal is coupled to common line 36 at junction 37. The other terminal of Resistor R1 is coupled to the other secondary winding terminal at junction 38. The source s terminal of FET Q3 is coupled to common line 36. Resistor R2 is coupled across the gate g and source s terminals of FET Q3. The drain d terminal of FET Q3 is coupled to line 16 for driving the Load.

In operation it can be seen that Pulse Transformer T1 is switched to DC source V1 when Switching Transistor Q1 is caused to switch to the conducting state by the application of a control pulse at terminal 30. Functionally, when Switching Transistor Q1 is switched ON, that is conducting, FET Q3 is being driven ON. The anode of CR2 is biased positive thereby putting it in the conductive state. When so conducting, current is delivered to the gate g terminal FET Q3 rapidly charging the gate capacitance and switching FET Q3 ON. When the control pulse applied to terminal 30 again switches OFF and causes Switching Transistor Q1 to be turned OFF, Pulse Transformer T1 is allowed to reset. During reset, the inductive kick-back of Pulse Transformer T1 causes Switching Transistor Q2 to conduct, thereby discharging the gate g capacitance of FET Q3. Diode CR3 is utilized to prevent the base-collector diode junction of Q2 from failing at reverse bias. It is understood that Pulse Transformer T1 has enough conductance to provide drive to Switching Transistor Q2 to cause the switching of FET Q3 OFF at a desired rate. Normally it would be expected that the unavoidable leakage inductance of Pulse Transformer T1 would limit the rate at which the FET gate capacitance could be charged or discharged. However, the use of Switching Transistor Q2 at turn OFF, transforms this leakage inductance, and effectively reduces it by a factor equal to the gain of the Switching Transistor. For those applications where switching at turn ON does not require as fast a switching rate as for turn OFF, there is no need to utilize a Switching Transistor in the charging path to the gate circuit of FET Q3. Detailed embodiments will be described below which provide for a Switching Transistor operation in the charging path as well as in the discharging path.

Resistor R1 is a damping Resistor to prevent excessive ringing or overshoot by Pulse Transformer T1, and is a discharge Resistor.

Resistor R2 is provided to assure that the gate terminal of FET Q3 does not accumulate static charge, and provides a defined impedance at the gate terminal to improve noise immunity and damp out potential oscillations.

In this configuration, the power consumed in the switching circuitry is very low, for example in the order of 15 milliwatts, while power in the order of 100 watts is being controlled by FET Q3.

Switching Transistors Q1 and Q2 can be low voltage devices, but must be switchable at very fast rates, for example in the order of 50 MHertz, but can be selected from components available commercially. Similarly, Diodes CR1, CR2, and CR3 can be selected from low voltage Diode devices available commercially, but must be selected from components having comparable response times. FET Q3 is a power transistor of a type available commercially.

Figure 3:
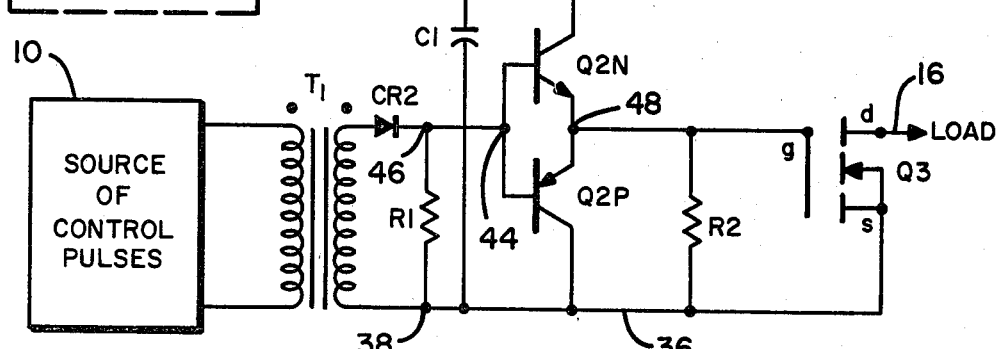
FIG. 3 is a detailed schematic circuit diagram of a Fast Switching Field Effect Transistor Driver Circuit utilizing two Switching Transistors in the gate charging and gate discharging circuit.

FIG. 3 is a detailed schematic circuit diagram of a fast switching field effect transistor driver circuit utilizing two Switching Transistors in the gate charging and discharging circuit. In this configuration, the operation of the input circuitry 10 and the primary of the Pulse Transformer are the same as that previously described. When components that have previously been described provide a similar function, they are given the same reference designation. As previously described, the circuit is to switch the power FET Q3 ON and OFF by switching its gate g high and low, respectively, in response to control pulses applied at input terminal 30 to the base terminal of Switching Transistor Q1. A relatively low voltage applied at terminal 30, for example in the range of 0 to 2 volts results in Switching Transistor Q1 being switched to the OFF state. In order to switch Transistor Q1 ON, the control pulses must be driven positive, for example in the range of 4 to 10 volts to achieve switching action.

In this configuration, a pair of Switching Transistors Q2N and Q2P are utilized, each having their base terminals coupled together at junction 44, which in turn is coupled to the cathode of Diode CR2 and Resistor R1 at point 46. The anode of Diode CR2 is coupled to one terminal of the secondary winding of the Pulse Transformer T1. Resistor R1 has its other terminal coupled to common line 36 at point 38. Capacitor C1 is coupled between the collector electrode of Switching Transistor Q2N and common line 36. The collector of Switching Transistor Q2P is coupled to common line 36. The emitter electrodes of Switching Transistors Q2N and Q2P are coupled to junction 48 which in turn is coupled to the gate g of FET Q3.

When operation first starts, Switching Transistor Q1 is switched ON by the application of a control pulse to its base electrode, thereby impressing 5 volts DC across the primary winding of Pulse Transformer T1. The voltage produced at the seondary winding will depend upon the turns ratio, and this secondary voltage will be applied to the anode of Diode CR2. The positive voltage on the anode of CR2 causes it to pass current to junction 46 where it diverts to discharge Resistor R1, to the junction 44 where it biases Switching Transistor Q2N to cause current flow to the base-emitter junction to charge the capacitance of the gate g of FET Q3, and through the base-collector junction to charge Capacitor C1. When the gate capacitance has been fully charged and FET Q3 has been switched ON, current flow in the gate circuit stops. Since the anode of Diode CR2 is still biased positive, current flow continues and the potential drop across Resistor R1 caused by current flow through it maintains the appropriate gate potential to cause FET Q3 to be held in the ON state.

When Switching Transistor Q1 is switched OFF by the control pulse, the primary and secondary voltages across Pulse Transformer T1 reverse. This reversal causes the primary voltage to be V1 minus V2 which for this configuration will be plus 5 volts DC minus 12 volts DC, resulting in a minus 7 volts DC. This reversal of voltage is transformed to the secondary, and results in the negative voltage being applied to the anode of Diode CR2 which causes it to be reversed-biased. This causes termination of current flow through Diode CR2, and thereby stops the current flow to Resistor R1. As the voltage across Resistor R1 decreases to 0, the gate potential for FET Q3 is driven to turn FET Q3 OFF. The rate at which the switching OFF occurs depends upon the rate at which the gate capacitance can be discharged. The discharge path is through the emitter-base junction of Switching Transistor Q2P and through discharge Resistor R1. This discharge current is amplified by the gain of the Switching Transistor Q2P, thereby providing a relatively large discharge current. This accelerates the discharge of the gate capacitance of FET Q3, and causes it to change its operating state to the OFF condition more rapidly than could otherwise be achieved.

During the voltage reversal and the discharge of the gate capacitance, there will be a tendency to discharge Capacitor C1. This discharge rate will be approximately proportional to the ratio of the gate capacitance for FET Q3, and the capacitance of Capacitor Cl. Accordingly, Capacitor C1 is selected to be of a substantially larger capacitance level than the gate capacitance.

The reverse voltage across Pulse Transformer T1 is not sustained, and eventually collapses. The primary and secondary voltages are then 0 and FET Q3 remains in the OFF state.

After the initial cycle when Capacitor C1 has been charged, operation is further enhanced. A subsequent application of a control pulse to terminal 30 for causing Switching Transistor Q1 to again be switched ON, results in the current flow into the base terminal of Switching Transistor Q2N. The charge on Capacitor C1 biases the collector of Switching Transistor Q2N positive allowing Switching Transistor Q2N to operate in its active state and results in a charging current to the gate g of FET Q3 that is determined by the level of base current flowing to Switching Transistor Q2N amplified by the gain of that Switching Transistor. Thus the gate Capacitance of FET Q3 is more rapidly charged and it is switched to the ON state. At the end of each positive transition of the gate g of FET Q3, whereby no further current drain is required, the current that is flowing to the base of Switching Transistor Q2N is utilized to charge Capacitor C1 through the base-collector junction of Switching Transistor Q2N. This function allows Capacitor C1 to be in a charged state ready for the next application of the control pulse to Switching Transistor Q1. The operation of Switching Transistor Q2P is the same as previously described for subsequent cycles. From the foregoing, then, it can be seen that the circuitry just described operates effectively through the use of a relatively inexpensive Pulse Transformer to provide for the enhanced switching rates for a power FET through the use of the gate capacitance charging and discharging circuits.

Figure 4:
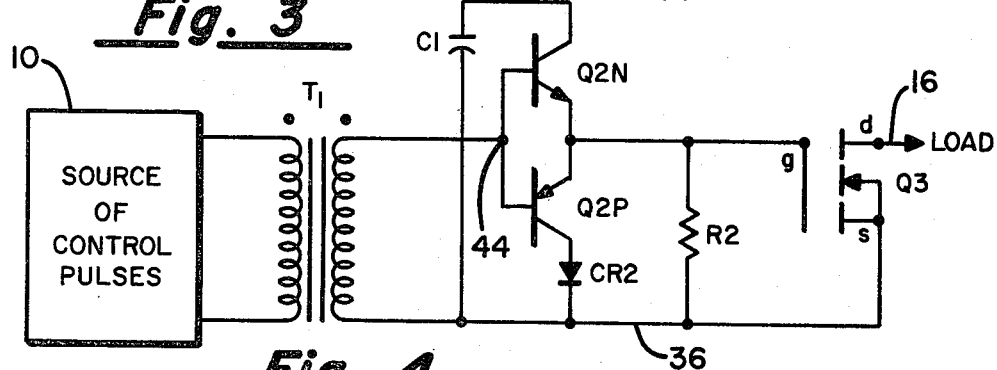
FIG. 4 is an alternative detailed schematic circuit diagram of a Fast Switching Field Effect Transistor Driver Circuit utilizing a Switching Transistor in the gate charging circuit and a Switching Transistor in the gate discharging circuit.

FIG. 4 is an alternative detailed schematic circuit diagram of the fast switching field effect transistor driver circuit. Again, components that have been previously described and referenced will bear the same reference numeral or reference designation. In this configuraton, the interconnections of Switching Transistors Q2N and Q2P together with Capacitor C1 are basically the same. Resistor R1 has been removed from the circuit, and Diode CR2 has been moved to be connected between the collector terminal of Switching Transistor Q2P and the common line 36. The circuit operation is very similar to that described with reference to FIG. 3, subject to the condition that some additional power is required to operate the driver due to the removal of Resistor R1. This results from the condition whereby the gate g of FET Q3 must be charged somewhat negatively when Pulse Transformer T1 voltage reverses, and then must be returned to 0 when the Pulse Transformer voltage collapses to 0. In this configuration, Diode CR2 is utilized in the collector circuit of Switching Transistor Q2P to isolate the base-collector path during reversal of voltages. In this configuration, the magnetizing current of Pulse Transformer T1 is utilized in place of the supply function of Resistor R1 in providing drive for Switching Transistor Q2P.

Circuit components will be selected to accommodate the characteristics of FET Q3 in conjunction with the control signals that are applied to the base of Switching Transistor Q1. For a characteristic embodiment, with FET Q3 having a gate capacitance in the range of 1 to 4 nanofarads, the value of Capacitor C1 would be selected to be approximately 10 times that of the gate capacitance, that is, in the range of 10 to 40 nanofarads. The value of Resistor R1 would be selected in the range of 1000 to 10,000 Ohms. Resistor R2 would be selected in the range of 10,000 to 100,000 Ohms. It should be understood that these are characteristic values and not intended as limitations on the scope of the invention.

Figure 5:
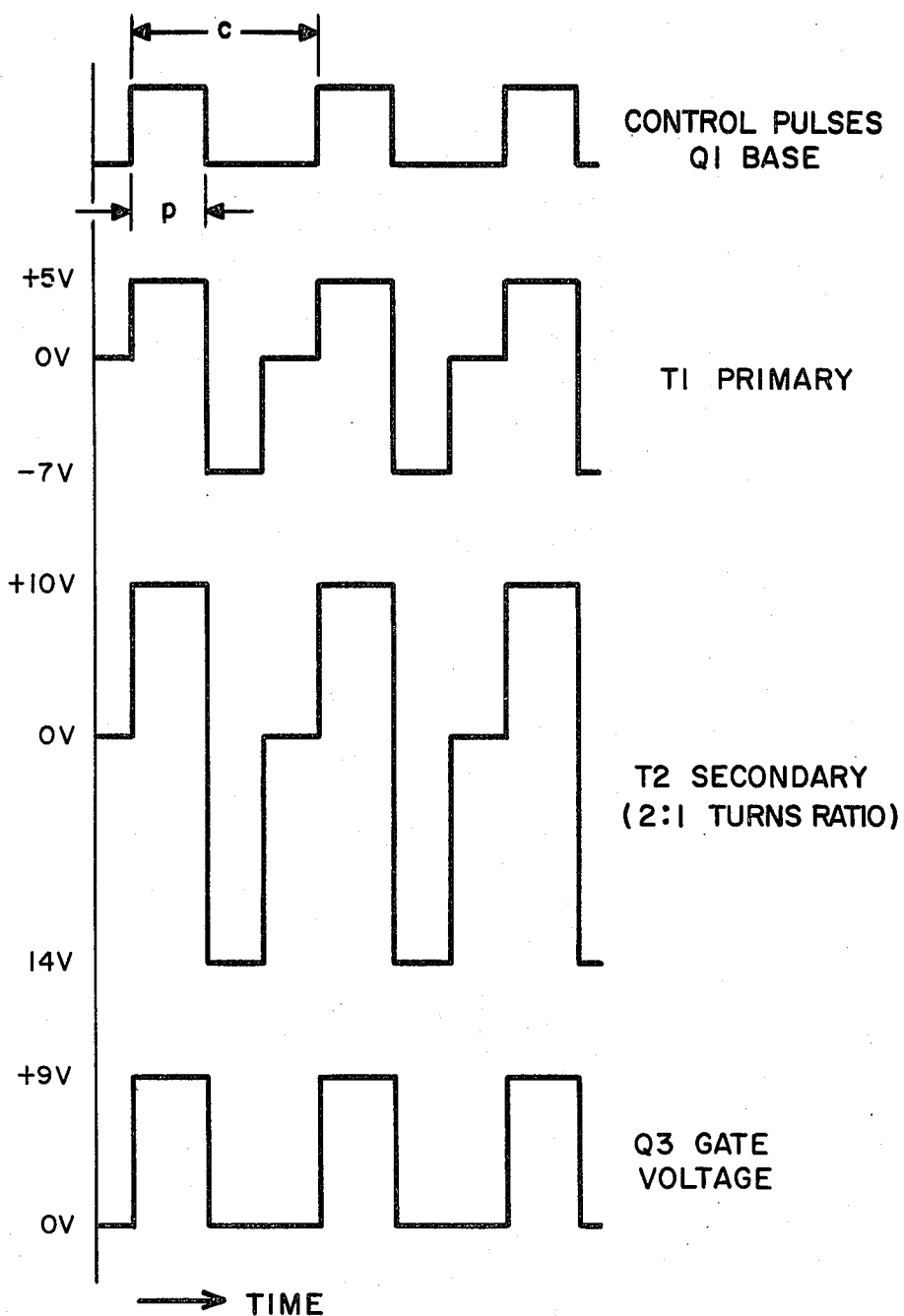
FIG. 5 illustrates the characteristic wave forms of the signal applied then input control, the signal across the primary of the Pulse Transformer, the signal across the secondary of the Pulse Transformer, and the signal applied to the gate of the Field Effect Transistor.

FIG. 5 illustrates the characteristic wave forms of the signal applied to the Input Control, the signal across the primary of the Pulse Transformer, the signal across the secondary of the Pulse Transformer, and the signal applied to the gate of the Field Effect Transistor. In a preferred embodiment, the Control Pulses occur in cycles, with a cycle c nominally having a duration of 5 nanoseconds. The pulse p has a nominal duration of 2 nanoseconds. It can be seen, then, that the occurence of a Control Pulse at the base of Switching Transistor Q1 results in the signal at the primary of Pulse Transformer T1 rising from 0 volts to 5 volts, and thereafter reversing to minus 7 volts when the Control Pulse is terminated. The primary voltage then returns to 0 volts and is stabilized for application of the next sequential Control Pulse. The illustrative wave forms show a relationship of a 2:1 turns ratio of the primary to the secondary windings of the Pulse Transformer. Accordingly, the excursions in the secondary are approximately twice that described for the primary. Finally, the signals applied to the gate g of FET Q3 switch from 0 volts to approximately plus 9 volts each time a Control Pulse is applied.

Having described the purposes and objectives of the invention, together with description of preferred embodiments of the invention, and operation thereof, what is intended to be protected by Letters Patent is set forth in the appended claims.

What is claimed is:

1. An improved inverter power supply circuit of the type having transformer coupling means including at least primary winding means and secondary winding means, each having first and second terminals;

input means coupled to said first and second terminals of said primary winding means for coupling to sources of dc voltages;

input switching means coupled to one of said first and second terminals of said primary winding means and said input means for switching current through said primary winding means in response to switching control signals applied thereto, thereby producing an alternating voltage across said primary winding means and said secondary winding means;

field effect transistor power switching means having gate means for controlling switching of said field effect transistor means between current conductive operational states, and non-current conductive operational states in response to signals applied to said gate means;

gate charging circuit means coupled intermediate said secondary winding means and said power switching means for rapidly charging said gate means for causing said field effect transistor means to be rapidly switched to the current conductive state in response to first ones of said control signals received by said input switching means;

gate discharging circuit means coupled intermediate said secondary winding means and said power switching means for rapidly discharging said gate means for causing said field effect transistor means to be rapidly switched to the non-current conductive state in response to second ones of said control signals received by said input switching means; and including diode means coupled intermediate said secondary winding means and said gate means, for providing a path of current conduction to rapidly charge the capacitance of said gate means for speeding up the switching of said field effect transistor means to the current conductive state;

said gate charging circuit means further including charging switching transistor means coupled intermediate said secondary winding means and said gate means for rapidly charging the capacitance of said gate means when said charging transistor means is switched to the conductive state in response to said input switching means being switched to the current conductive state; wherein the improvement comprises:

capacitor means included in said gate charging circuit means, said capacitor means coupled to said charging switching transistor means for biasing said charging switching transistor means to the current conductive state.

2. A circuit as in claim 1 wherein said charging switching transistor means includes a base terminal coupled to said secondary winding means, an emitter terminal coupled to said gate means, and a collector terminal coupled to said capacitor means.

3. A circuit as in claim 1 wherein said gate discharging circuit means further includes discharge switching transistor means coupled intermediate said secondary winding means and said gate means for rapidly discharging the capacitance of said gate means when said discharge switching transistor means is switched to the conductive state in response to said input switching means being switched to the non-current conductive state, said discharge switching transistor means further including an emitter terminal coupled to said gate means, a base terminal coupled to said first terminal of said secondary winding means, and a collector terminal coupled to said second terminal of said secondary winding means; and further comprising:

further diode means coupled intermediate said collector terminal of said discharge switching transistor means and said second terminal of said secondary winding means for isolating the base-collector path of said discharge switching transistor means during reversal of voltage in said transformer coupling means.

4. In an inverter power supply circuit including:

pulse transformer means having at least primary winding means and secondary winding means, each having first and second terminal means;

input means coupled to said primary winding means for coupling to sources of dc voltages;

input switching means including first switching transistor means coupled to said primary winding means for switching current through said primary winding means in response to switching control signals applied thereto, thereby producing an alternating voltage across said primary winding means and said secondary winding means;

field effect transistor power switching means for driving a load and having gate means for controlling switching of said field effect transistor means between current conductive and non-current conductive states of operation in response to signals applied to said gate means, and further including source means and drain means; and gate control means coupled intermediate said gate means and said secondary winding means for rapidly charging and discharing gate capacitance of said field effect transistor means for causing said field effect transistor means to be rapidly switched on and off in response to said control signals applied to said input switching means; the feature wherein said gate control means includes:

common line means for coupling said second terminal means of said secondary winding means to said source means;

first resistor means coupled across said first and second terminal means of said secondary winding means;

first diode means coupled intermediate said first terminal means and said gate means;

second resistor means coupled across said gate means and said source means;

second diode means having a first diode terminal coupled to said common line means and a second diode terminal; and second switching transistor means having a base electrode coupled to said first terminal means, an emitter electrode coupled intermediate said first diode means and said gate means, and a collector electrode coupled to said second diode terminal.

5. In a inverter power supply circuit including:

pulse transformer means having at least primary winding means and secondary winding means, each having first and second terminal means;

input means coupled to said primary winding means for coupling to sources of dc voltages;

input switching means including first switching transistor means coupled to said primary winding means for switching current through said primary winding means in response to switching control signals applied thereto, thereby producing an alternating voltage across said primary winding means and said secondary winding means;

field effect transistor power switching means for driving a load and having gate means for controlling switching of said field effect transistor means between current conductive and non-current conductive states of operation in response to signals applied to said gate means, and further including source means and drain means; and gate control mens coupled intermediate said gate means and said secondary winding means for rapidly charging and discharging gate capacitance of said field effect transistor means for causing said field effect transistor means to be rapidly switched on and off in response to said control signals applied to said input switching means; the feature wherein said gate control means includes:

common line means for coupling said second terminal means of said secondary winding means to said source means;

a circuit junction;

a diode means having a first diode terminal coupled to said first terminal means and a second diode terminal coupled to said circuit junction;

resistor means coupled intermediate said circuit junction and said common line means;

capacitor means having one capacitor terminal coupled to said common line means and a second capacitor terminal;

charging switching transistor means having a collector electrode coupled to said second capacitor terminal, a base electrode coupled to said circuit junction, and an emitter coupled to said gate means; and discharging switching transistor means having an emitter electrode coupled to said gate means, a base electrode coupled to said circuit junction, and a collector electrode coupled to said common line means.

6. In an inverter power supply circuit including:

pulse transformer means having at least primary winding means and secondary winding means, each having first and second terminal means;

input means coupled to said primary winding means for coupling to sources of dc voltages;

input switching means including first switching transistor means coupled to said primary winding means for switching current through said primary winding means in response to switching control signals applied thereto, thereby producing an alternating voltage across said primary winding means and said secondary winding means;

field effect transistor power switching means for driving a load and having gate means for controlling switching of said field effect transistor means between current conductive and non-conductive states of operation in response to signals applied to said gate means, and further including source means and drain means; and gate control means coupled intermediate said gate means and said secondary winding means for rapidly charging and discharging gate capacitance of said field effect transistor means for causing said field effect transistor means to be rapidly switched on and off in response to said control signals applied to said input switching means; the feature wherein said gate control means includes:

common line means for coupling said second terminal means of said secondary winding means to said source means;

a circuit junction coupled to said first terminal means;

capacitor means having one capacitor terminal coupled to said common line means an a second capacitor terminal;

charging switching transistor means having a collector electrode coupled to said second capacitor terminal, a base electrode coupled to said circuit junction, and an emitter electrode coupled to said gate means;

diode means having one diode terminal coupled to said common line means and a second diode terminal; and discharging switching transistor means having an emitter electrode coupled to said gate means, a base electrode coupled to said circuit junction, and a collector electrode coupled to said second diode terminal.

* * * * *